US006182270B1

(12) United States Patent
Feldmann et al.

(10) Patent No.: US 6,182,270 B1
(45) Date of Patent: Jan. 30, 2001

(54) LOW-DISPLACEMENT RANK PRECONDITIONERS FOR SIMPLIFIED NON-LINEAR ANALYSIS OF CIRCUITS AND OTHER DEVICES

(75) Inventors: Peter Feldmann, Short Hills; David Esley Long, Chatham; Robert C. Melville, New Providence, all of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 08/975,250

(22) Filed: Nov. 20, 1997

Related U.S. Application Data (60) Provisional application No. 60/032,388, filed on Dec. 4, 1996.

(51) Int. Cl.[7] .............................. G06F 17/50; G06F 17/11; G06F 17/16
(52) U.S. Cl. .................................... 716/5; 703/2; 703/14; 708/802
(58) Field of Search ........................ 395/500.02–500.19, 395/500.23, 500.34–500.37; 708/801–804; 716/1–21; 703/13–16, 2

(56) References Cited

U.S. PATENT DOCUMENTS

| | | | |
|---|---|---|---|
| 5,136,538 | * 8/1992 | Karmarkar et al. | 708/607 |
| 5,604,911 | * 2/1997 | Ushiro | 703/2 |
| 5,867,416 | * 2/1999 | Feldmann et al. | 708/801 |

OTHER PUBLICATIONS

M. Rosch, "Schnelle des Stationare Simulation Nichtlinearer Schaltungen," Dissertation, Technical University of Munich, 1992, vol. 46, No. 3, May 1992, pp. 168–176.*

PTO 99–5358 (English translation of the article by M. Rosch and K. Antreich, "Schnelle Stationare Simulation Nichtlinearer Schaltungen im Freuenzebereich," AEU, vol. 46, No. 3, pp. 1680176, 1992, translated by The Ralph McElroy Translation Company, Sep. 1999.*
PTO 99–5369 (English translation of the German article by M. Rosch, "Schnelle Simulation des Stationaren Verhaltens Nichtlinearer Schaltungen," Dissertation, Technical University of Munich, 1992, translated by Schreiber Translations, Inc., Translated Nov. 1999.*

(List continued on next page.)

*Primary Examiner*—Paul R. Lintz
*Assistant Examiner*—Phallaka Kik
(74) *Attorney, Agent, or Firm*—Ryan, Mason & Lewis, LLP (57) ABSTRACT

Methods and apparatus for performing non-linear analysis using preconditioners to reduce the computation and storage requirements associated with processing a system of equations. A circuit, system or other device to be analyzed includes n unknown waveforms, each characterized by N coefficients in the system of equations. A Jacobian matrix representative of the system of equations is generated. The Jacobian matrix may be in the form of an n×n sparse matrix of dense N×N blocks, such that each block is of size $N^2$. In an illustrative embodiment, a low displacement rank preconditioner is applied to the Jacobian matrix in order to provide a preconditioned linear system. The preconditioner may be in the form of an n×n sparse matrix which includes compressed blocks which can be represented by substantially less than $N^2$ elements. For example, the compressed blocks may each be in the form of a low displacement rank matrix corresponding to a product of two generator matrices having dimension N×α, where α<<N. The preconditioned linear system may be solved by factoring the preconditioner using a sparse lower-upper (LU) factorization or other similar sparse factorization method applied to the compressed blocks.

23 Claims, 5 Drawing Sheets

OTHER PUBLICATIONS

Feldmann et al. ("Efficient Frequency Domain Analysis of Large Nonlinear Analog Circuits", Proceedings of the IEEE Custom Integrated Circuits Conference, May 1996, pp. 1–4).*

Brachtendorf et al. ("A simulation tool for the analysis and verification of the steady state of circuit designs", International Journal of Circuit Theory and Applications, vol. 23, pp. 311–323, Jan. 1995).*

Gremban et al. ("Performance Evaluation of a New Parallel Preconditioner", NTIS, 34 pages, Oct. 1, 1994).*

Gover et al. ("Displacement rank and quasitriangular decomposition for r–Toeplitz matrices", Linear Algebra Applic., vol. 88–89, pp. 329–348, Jan. 1, 1987.*

K.S. Kundert, J.K. White and A. Sangiovanni–Vincentelli, "Steady–State Methods for Simulating Analog and Microwave Circuits," Kluwer, Boston, MA, pp. 91–93, 124–132, 1990.

V. Rizzoli, C. Cecchetti, A. Lipparini and F. Mastri, "General–Purpose Harmonic Balance Analysis of Nonlinear Microwave Circuits Under Multitone Excitation," IEEE Trans. Microwave Theory and Tech., vol. MTT–36, No. 12, pp. 1650–1660, Dec. 1988.

V. Rizzoli, F. Mastri, F. Sgallari and V. Frontini, "The Exploitation of Sparse Matrix Techniques in Conjunction with the Piece– Wise Harmonic Balance Method for Nonlinear Microwave Circuit Analysis," IEEE MTT–S Int. Microwave Symp. Digest, Dallas, TX, pp. 1295–1298, May 1990.

D. Long, R. Melville, K. Ashby and B. Horton, "Full–chip Harmonic Balance," Proceedings of the IEEE Custom Integrated Circuits Conference, May 1997.

P. Feldmann, R. Melville and D. Long, "Efficient Frequency Domain Analysis of Large Non–Linear Analog Circuits," Proceedings of the IEEE Custom Integrated Circuits Conference, May 1996.

R. Melville, P. Feldmann and J. Roychowdhury, "Efficient Multi–Tone Distortion Analysis of Analog Integrated Circuits,"Proceedings of the IEEE Custom Integrated Circuit Conference, May 1995, pp. 1–4.

M. Rösch and K. Antreich, "Schnelle Stationare Simulation Nichtlinearer Schaltungen im Freuenzebereich," AEU, vol. 46, No. 3, pp. 168–176, 1992.

T. Kailath and A. Sayed, "Displacement Structure: Theory and Applications," SIAM Review, vol. 37, No. 3, pp. 297–386, Sep. 1995.

I. Gohberg and V. Olshevsky, "Circulants, Displacements and Decompositions of Matrices," Integr. Equat. Oper. Th, vol. 15, pp. 730–743, Birkhauser Verlag, Basel, 1992.

I. Gohberg and V. Olshevsky, "Complexity of Multiplication With Vectors for Structures Matrices," Linear Algebra and its Applications, 202, pp. 163–192, 1994.

B. Troyanovsky, Z. Yu, L. So and R.W. Dutton, "Relaxation–Based Harmonic Balance Technique for Semiconductor Device Simulation," Proceedings of the IEEE/ACM International Conference on Computer–Aided Design, pp. 700–703, Nov. 1995.

H.G. Brachtendorf, G. Welsch, R. Laur and A. Buse–Gerstner, "Numerical Steady State Analysis of Electronic Circuits Driven by Multi–Tone Signals," Electrical Engineering 79, pp. 103–112, Springer–Verlag, 1996.

H.G. Brachtendorf, G. Welsch, and R. Laur, "A Simulation Tool for the Analysis and Verification of the Steady State of Circuit Designs," International Journal of Circuit Theory and Applications, vol. 23, pp. 311–323, 1995.

K.S. Kundert and A. Sangiovanni–Vincentelli, "Simulation on Nonlinear Circuits in the Frequency Domain," IEEE Transactions on Computer–Aided Design, vol. CAD–5, No. 4, pp. 521–535, Oct. 1986.

V. Rizzoli, A. Lipparini, A. Costanzo, F. Mastri, C. Cecchetti, A. Neri and D. Masotti, "State of the Art Harmonic Balance Simulation of Forced Nonlinear Microwave Circuits by the Piecewise Technique," IEEE Trans. Microwave Theory and Tech., vol. 40, No. 1, pp. 12–28, Jan. 1992.

V. Rizzoli, A. Costanzo, P.R. Ghigi, F. Mastri, D. Masotti and C. Cecchetti, "Recent Advances in Harmonic–Balance Techniques for Nonlinear Microwave Circuit Simulation, "AEU, vol. 46, No. 4, pp. 286–297, 1992.

* cited by examiner

LOW-DISPLACEMENT RANK PRECONDITIONERS FOR SIMPLIFIED NON-LINEAR ANALYSIS OF CIRCUITS AND OTHER DEVICES

RELATED APPLICATION

The present application claims the benefit of U.S. Provisional Application No. 60/032,388, filed Dec. 4, 1996 and entitled "Low-Displacement Rank Preconditioners for Periodic and Quasi-Periodic Boundary Value Problems."

FIELD OF THE INVENTION

The present invention relates generally to analysis techniques for determining the steady-state response of non-linear electronic circuits, networks, systems or other devices, and more particularly to steady-state analysis techniques based on iterative linear solvers which utilize preconditioners to simplify the analysis process.

BACKGROUND OF THE INVENTION

A variety of numerical analysis methods have been developed for determining the steady-state response of non-linear electronic circuits, networks and other devices. These methods include, for example, finite differencing and harmonic balance techniques. These and other steady-state analysis methods generally involve solving a boundary-value problem on a system of non-linear ordinary differential equations or differential algebraic equations. Each of the methods typically generates a large linear system of equations which needs to be solved many times during a so-called "outer" iteration of the method as it finds the solution to the system of non-linear equations. The large linear system of equations can usually be characterized as a Jacobian matrix of partial derivatives of the non-linear system, and the solution of the Jacobian matrix is a major computational bottleneck in the steady-state analysis process. For steady-state simulation of an electrical network or integrated circuit of even moderate complexity, the Jacobian matrices can be extremely difficult to solve using direct factorization.

An alternative approach to direct factorization of the Jacobian matrix involves the use of iterative linear solution methods, also referred to as iterative linear "solvers." Although Jacobian matrices are often very large, these matrices are typically structured in a manner which facilitates fast matrix-vector multiplication, and can therefore be solved using well-known iterative linear solution methods such as the QMR or GMRES algorithms. The speed and robustness of these and other iterative linear methods can depend critically on the choice of a preconditioner, which is used to generate a relatively easy-to-invert approximation to a given Jacobian matrix. Unfortunately, conventional preconditioning techniques provide insufficient reductions in computational complexity. As a result, steady-state analysis using iterative linear solution methods remains unduly computationally intensive and therefore impractical in a wide variety of important applications.

SUMMARY OF THE INVENTION

The invention utilizes appropriately-selected preconditioners to reduce the storage and computation requirements associated with non-linear analysis techniques such as finite differencing and harmonic balance. In accordance with the invention, a low displacement rank or other suitable preconditioner is in the form of a matrix of compressed blocks. The preconditioner is applied to a Jacobian matrix representation of a circuit, system or other device to be analyzed, in order to generate a preconditioned linear system which can be solved efficiently using an iterative linear solution method employing the compressed blocks of the preconditioner matrix. This substantially reduces the storage and computation requirements which would otherwise be associated with processing the Jacobian matrix.

In an illustrative embodiment of the invention, the device being analyzed may be characterized by n unknowns with N coefficients used to represent each of the unknowns, and the Jacobian matrix may be in the form of a sparse n×n matrix of dense N×N blocks. A low displacement rank preconditioner is used to generate the preconditioned system based on the Jacobian matrix. The low displacement rank preconditioner has a matrix structure which approximates that of a circulant matrix, but can capture more information from the Jacobian matrix than a conventional preconditioner. For example, the preconditioner may be in the form of a sparse n×n matrix of compressed low displacement rank blocks. Each of the compressed blocks may have a structure corresponding to the product of two generator matrices of dimension α×N, where α<<N, such that each of the blocks in the preconditioner can be represented by substantially less than $N^2$ elements. The preconditioned system can then be solved by factoring the preconditioner matrix using a conventional sparse lower-upper (LU) factorization or other similar technique operating on the compressed blocks. In accordance with the invention, processing operations can thus be performed on compressed blocks which are effectively of a size $<<N^2$, rather than the size $N^2$ blocks of the original Jacobian matrix, and therefore with substantially reduced storage and computation requirements. The invention may also utilize other types of preconditioners to generate a preconditioned linear system which can be solved using operations on compressed blocks.

DETAILED DESCRIPTION OF THE INVENTION

The present invention will be illustrated below in conjunction with exemplary preconditioning techniques particularly well-suited for use in steady-state analysis of large nonlinear circuits, networks, systems and other devices. It should be understood, however, that the invention is not limited to use with any particular type of analysis. The disclosed techniques are more generally suitable for use with a wide variety of analysis techniques and in numerous applications, including finite differencing and harmonic balance. It should be noted that the term "analysis" as used herein is intended to include simulation as well as other types of analysis techniques. The term "matrix" as used herein is intended to include arrays or other similar arrangements of numerical elements or blocks. The term "preconditioner" as used herein refers generally to an implementation of a process which alters a system of equations characterizing a circuit, network, system or other device, or a suitable representation of such a system of equations, in order to simplify non-linear analysis. The implementation may be in the form of software, hardware or firmware as well as various combinations thereof.

Figure 1:
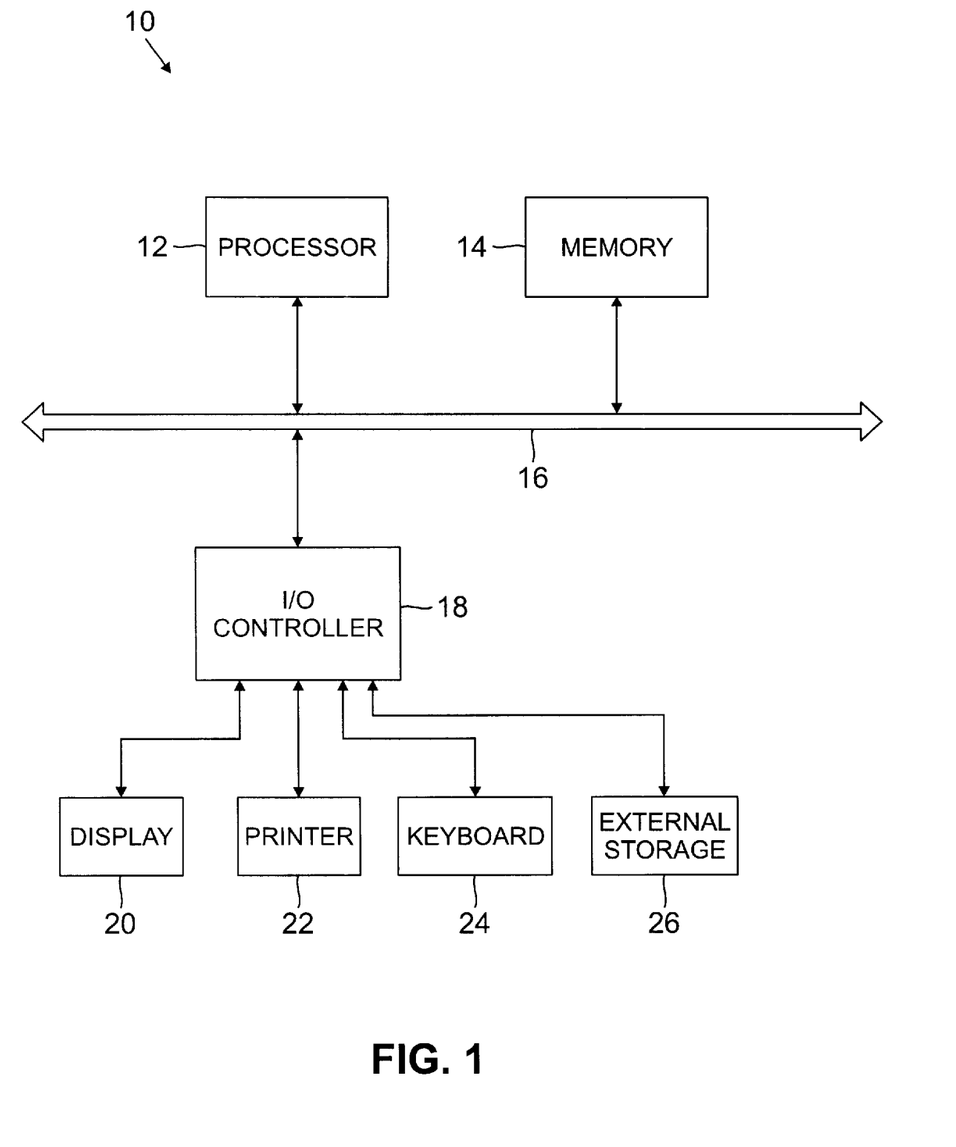
FIG. 1 is a block diagram of a processing system in which non-linear analysis techniques may be implemented in accordance with the invention.

FIG. 1 shows an exemplary processing system 10 in which nonlinear analysis techniques in accordance with the present invention may be implemented. The processing system 10 includes a processor 12 and a memory 14 which are connected to communicate via a bus 16. The system 10 further includes an input/output (I/O) controller 18 which is connected to the bus 16 in order to communicate with the processor 12 and memory 14. The I/O controller 18 in conjunction with the processor 12 directs the operation of a number of peripheral components including a display 20, a printer 22, a keyboard 24 and an external storage device 26. The elements 12, 14, 16 and 18 of system 10 may represent portions of a desktop or portable personal computer, a microcomputer, a workstation, a mainframe computer or other type of digital processor. The memory 14 and external storage device 26 may be electronic, magnetic or optical storage devices. The present invention may be implemented in the form of a computer software program stored in memory 14. The program is executed by processor 12 in accordance with user-supplied input circuit, network, system or device data to produce a desired output analysis in a predetermined format on display 20 or on a print-out generated by printer 22. The user-supplied input data may be entered at the keyboard 24 or read from one or more files of external storage device 26.

The invention in an illustrative embodiment makes use of low displacement rank preconditioners to reduce the computation requirements of iterative linear solution methods used in nonlinear analysis. The displacement rank of a matrix is a quantitative measure of how close the matrix is to being a Toeplitz matrix, where a Toeplitz matrix is a matrix which is constant along its diagonals. A block Toeplitz matrix repeats the same block along each diagonal. A Toeplitz or block Toeplitz matrix may be represented as:

$$\begin{bmatrix} B_1 & B_2 & B_3 & \ldots & B_N \\ B_{-2} & B_1 & B_2 & \ldots & \vdots \\ B_{-3} & B_{-2} & B_1 & \ldots & \vdots \\ \vdots & \ddots & \ddots & \ddots & B_2 \\ B_{-N} & \ldots & B_{-3} & B_{-2} & B_1 \end{bmatrix} \quad (1)$$

An N-point displacement operator Z is defined as:

$$Z = \begin{bmatrix} 0 & & & & \\ 1 & 0 & & & \\ & 1 & 0 & & \\ & & 1 & \ddots & \\ & & & 1 & 0 \end{bmatrix}. \quad (2)$$

For a given square N×N matrix A, the construction $ZAZ^T$ advances the entries of A down one position along each diagonal and introduces zeros to fill in the first row and column. An example for N=3 is as follows:

$$Z\begin{bmatrix} a_1 & b_1 & d_1 \\ c_1 & a_2 & b_2 \\ e_1 & c_2 & a_3 \end{bmatrix} Z^T = \begin{bmatrix} 0 & 0 & 0 \\ 0 & a_1 & b_1 \\ 0 & c_1 & a_2 \end{bmatrix}. \quad (3)$$

If A is a Toeplitz matrix, then the displacement $A-ZAZ^T$ is zero except in its first row and first column. The displacement rank of an N×N matrix A is defined as the rank of $A-ZAZ^T$. For simplicity, the displacement $A-ZAZ^T$ of A will be denoted $\nabla A$, with Z understood from the context, such that disp_rank(A)=rank($\nabla A$). The displacement rank of a given Toeplitz matrix is at most two.

For preconditioning a steady-state Jacobian matrix, it is convenient to define a circulant displacement operator $Z_\phi$ given by:

$$Z_\phi = \begin{bmatrix} 0 & & & & \phi \\ 1 & 0 & & & \\ & 1 & 0 & & \\ & & 1 & \ddots & \\ & & & 1 & 0 \end{bmatrix} \quad (4)$$

as an alternative to the displacement operator Z defined in Equation (2) above. It should be noted that $Z_\phi$ is invertible only if $\phi \neq 0$, while the displacement operator Z of Equation (2) is singular. The displacement $\nabla A$ of the matrix A then becomes $\nabla A = A - Z_\phi A Z_\phi^{-1}$, where, as previously noted, $Z_\phi$ is invertible only if $\phi \neq 0$. The rank of the displacement $\nabla A$ is zero only when A is circulant. A small numerical rank of the displacement $\nabla A$ indicates that A is "almost circulant."

The circulant displacement operator $Z_\phi$ is actually a special case of a general construction known as a factor circulant. Given an N-vector x (called a generator), a factor circulant $circ_\phi(x)$ is given by the following N×N matrix:

$$circ_\phi(x) = \begin{bmatrix} x_1 & \phi x_N & \phi x_{N-1} & \phi x_3 & \phi x_2 \\ x_2 & x_1 & \phi x_N & & \phi x_3 \\ x_3 & x_2 & x_1 & & \vdots \\ \vdots & \ddots & \ddots & \ddots & \phi x_N \\ x_N & x_{N-1} & x_{N-2} & \ldots & x_1 \end{bmatrix}. \quad (5)$$

Similar to ordinary circulants, factor circulants are closed under inversion, and the product of a factor circulant with an N-vector can be computed in a time O(N logN) using a Fast Fourier Transform (FFT), where O(.) denotes "on the order of." In accordance with the invention, the following are a number of properties which allow the above-described low displacement rank preconditioners to be used to implement a fast inversion algorithm for Jacobian matrices:

1. A rank $\alpha$ generator for $\nabla A$ is a pair of matrices (X, Y) of sizes N×$\alpha$, such that $\nabla A = XY^T$.

2. A generator (X, Y) can be obtained from inspection of $\nabla A$ or by computing a singular value decomposition of $\nabla A$.

3. It is possible to reconstruct A from the generator, given that:

$$\nabla A = XY^T \leftrightarrow A = circ_1(x_0) + \frac{\phi}{\phi - \psi} \sum_{k=1}^{\alpha} circ_\phi(x_k) circ_\psi(y_k)^T \quad (6)$$

in which $x_k$ is column k of X, $y_k$ is column k of Y, and $x_0$ is a vector such that A and $circ_1(x_0)$ have the same last column. One possible alternative displacement $\nabla A$ is of the form $\nabla A = (Z_{+1}A - AZ_{-1})$, where $Z_{+1}$ corresponds to the above-defined $Z_\phi$ matrix with $\phi=+1$, and $Z_{-1}$, corresponds to the $Z_\phi$ matrix with $\phi=-1$. The displacement $\nabla A$ in this case may be written as $GH^T$, where $G$ and $H$ are $N \times \alpha$ matrices. A can be then be reconstructed as:

$$A = \frac{1}{2}\sum_{k=1}^{\alpha} circ_{+1}(g_k) circ_{-1}(rev(h_k)) \quad (7)$$

where $rev(h_k)$ is the vector which results by reversing the positions of the elements of vector $h_k$.

4. Given the $\alpha$-term sum in property (3) above, a matrix-vector product Aw (i.e., an "apply" operation) can be computed in a time $O(\alpha N \log N)$ by using an FFT to perform each of the factor circulant apply operations.

5. For the displacement operation given in (6), $$disp\_rank(AB) \leq disp\_rank(A) + disp\_rank(B), \text{ and}$$

$$disp\_rank(A^{-1}) = disp\_rank(A).$$

Similar properties hold for the displacement operation given in (7).

In accordance with the invention, low displacement rank preconditioners can be generated for solving the Jacobian matrices used in finite differencing, harmonic balance and other non-linear analysis techniques. This process will first be illustrated for the case of a periodic finite differencing technique, in which a stimulus b(t) with period T is applied to the circuit, system or other device under analysis. The Jacobian matrix in this example is generated for the following exemplary system of non-linear differential equations:

$$f(x(t)) + d/dt \, q(x(t)) - b(t) = 0 \quad (8)$$

in which x(t) is an n-vector of circuit variables, such as currents, voltages, charges and fluxes. The f(x(t)) term represents the contribution of non-reactive circuit components, such as resistors. The d/dt q(x(t)) term represents the contribution of reactive circuit components, such as capacitors and inductors. The stimulus term b(t) represents one or more independent sources, which may be sinusoidal signals or tones of incommensurate frequencies. The method of finite differencing is usually limited to the case of periodic b(t). The period T is discretized into N intervals, which are assumed for simplicity of illustration to be evenly spaced. An N-point central difference operator $\Delta$, which is an approximation to the derivative d/dt in Equation (8), is defined as:

$$\Delta = \Delta_N = \begin{bmatrix} +\delta & & & \cdots & -\delta \\ -\delta & +\delta & & & \\ & -\delta & +\delta & & \\ & & & \ddots & \\ +\delta & & & & -\delta \end{bmatrix} \quad (9)$$

where $\delta = T/(2N)$. Discretization converts the n-dimensional system (8) into an nN-dimensional system of non-linear equations which no longer includes the d/dt operator. The Jacobian matrix in this example takes the following form:

$$G + S^{-1} \bigoplus_{k=1}^{n} \Delta SC = \begin{bmatrix} g_1 & +\delta c_2 & & & \cdots & -\delta c_{N-1} \\ -\delta c_1 & g_2 & +\delta c_3 & & & \\ & -\delta c_2 & g_3 & +\delta c_4 & & \\ & & & \ddots & & +\delta c_N \\ +\delta c_1 & & & & -\delta c_{N-1} & g_N \end{bmatrix} \quad (10)$$

where $$G = \begin{bmatrix} g_1 & & & & \\ & g_2 & & & \\ & & g_3 & & \\ & & & \ddots & \\ & & & & g_N \end{bmatrix}, C = \begin{bmatrix} c_1 & & & & \\ & c_2 & & & \\ & & c_3 & & \\ & & & \ddots & \\ & & & & c_N \end{bmatrix} \quad (11)$$

and each $g_k$ and $c_k$ are matrices of dimension n. In this example, $g_k$ is the individual circuit Jacobian matrix $\partial f/\partial x$ evaluated at the time point $t_k=kT/N$ and $c_k$ is $\partial q/\partial x$ evaluated at $t_k$. For all k, the combination of $(g_k+c_k)$ will have the same symbolic structure, since the symbolic structure is fixed by the circuit itself. The matrices S and $S^{-1}$ are stride permutations used to interchange the blocking of the matrix. The permutation S is defined as $[1, nN] \rightarrow [1, Nn]$ in which data arranged as N groups of n items each are re-arranged into n groups of N items each. This operation can be performed in a time O(nN) using a simple copying loop. The matrix S $diag(c_1, \ldots, C_N) S^{-1}$ takes the form of a sparse arrangement of diagonal N×N blocks, where the sparsity pattern is given by the structure of the $c_k$. This matrix is in the proper format for application of the central difference operator $\Delta$ to each N×N block. Finally, the time derivative of the sequence $c_k$ is put back into the proper pattern for addition to the $g_k$ term. A matrix-vector product with such a Jacobian matrix can generally be calculated in a time O(nN). This bound assumes that each $g_k$ and $c_k$ is highly sparse, as is typical for individual circuit Jacobian matrices. In practice, the number of symbolic non-zeros in each $g_k$ is typically less than 5n and the $c_k$ are even more sparse.

As previously noted, the present invention utilizes low displacement rank preconditioners to simplify computations involving Jacobian matrices such as that described above for the case of periodic finite differencing analysis. In order to generate a suitable low displacement rank preconditioner for processing the Jacobian matrix of the above periodic finite differencing example, the sequence of matrices $g_k$, k=1, 2, . . . , N is used to form a time series $h(k)=g_k[a, b]$ by fixing on the same symbolic non-zero with index $[a,b]$, $1 \leq a, b \leq n$ in each of the matrices $g_k$. In other words, h(k) is now a sequence of real numbers rather than a sequence of n×n sparse matrices. There is one such series for each symbolic non-zero, and due to sparsity the total number of such sequences is only on the order of n rather than $n^2$. A selection of a number $\beta$ of averaging sections, $1 \leq \beta << N$, is then made. Values of $\beta$ of approximately 4 or 8 are suitable for many applications. The interval [0, T) is partitioned into $\beta$ sections, and h is averaged over each section individually.

Figure 2A:
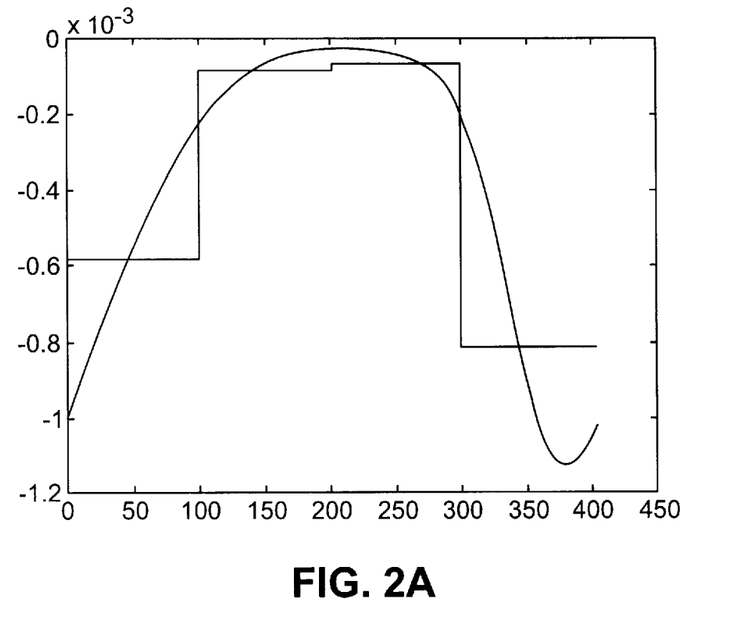
FIGS. 2A and 2B illustrate a sectional average and its corresponding displacement, respectively, for a waveform in an exemplary periodic finite differencing analysis in accordance with the invention.
Figure 2B:
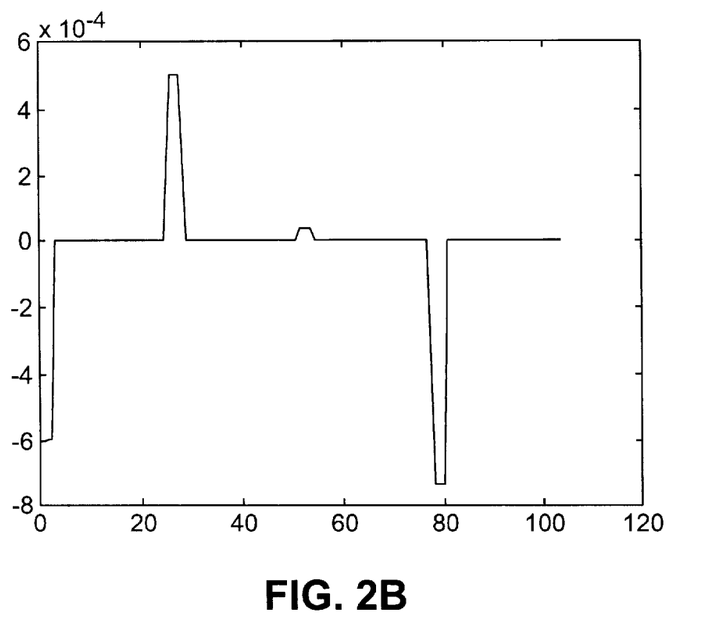

FIG. 2A illustrates the averaging process for a given g waveform for a small transistor circuit using a $\beta=4$ section average. The continuous curve corresponds to the original g waveform, which is separated into four sections, and the stepped waveform represents the sectional average over the four sections. The y-axis in FIGS. 2A and 2B represents signal amplitude, and the x-axis represents time. The continuous g waveform is periodic with period T on the order of 400 units. Each of the four sections of the g waveform, corresponding to time periods 0–100, 100–200, 200–300 and 300–400 on the x-axis, is averaged to produce the corresponding level in the sectional average.

After the sectional averaging, for each of the pairs [a, b], $g_k[a, b]$ is replaced by the N-point discretization of the sectional average. This processing can be performed for both G and C matrices in a time $O(\beta N)$ per symbolic non-zero, for a total time $O(\beta nN)$. The resulting matrices are denoted avg(G, $\beta$) and avg(C, $\beta$). FIG. 2B shows the effect of this displacement process on the sectional average of FIG. 2A. The displacement process in this example shifts the sectional average waveform forward by one position, and then subtracts it from the original. The result is a "blip" at each section boundary as shown in FIG. 2B, where the magnitude of a given blip corresponds to the difference between the averages of the adjacent sections. A suitable low displacement rank preconditioner with the same sparsity as the original matrix may then be computed as avg(G, $\beta$)+$\Delta$avg(C, $\beta$), in a time $O(nN)$, where $\Delta$ is the central difference operator defined previously.

A sparse factorization process in accordance with the invention will now be described. The sparse factorization process takes advantage of the structure of the low displacement rank preconditioner described above for the case of finite differencing in order to simplify computations involving the Jacobian matrix. It should be noted that a block diagonal preconditioner, which is circulant in the time domain, is usually easy to invert. As a result, there is a tradeoff between the number of iterations of the iterative linear solver and the expense associated with preconditioning at each iteration. The sparse factorization process to be described below provides improved performance relative to a block diagonal preconditioner, by significantly reducing the number of iterations required by the linear solver without unduly increasing the costs associated with preconditioning.

The sparse factorization process initially performs a symmetric permutation on the Jacobian matrix. The effect of a symmetric permutation using S and $S^{-1}$ on the Jacobian matrix in (10) is to convert a central-difference pattern of sparse blocks into a sparse pattern of central difference blocks, as shown below:

$$S\begin{bmatrix} g_1 & +\delta c_2 & & \cdots & -\delta c_{N-1} \\ -\delta c_1 & g_2 & +\delta c_3 & & \\ & -\delta c_2 & g_3 & +\delta c_4 & \\ & & & \ddots & +\delta c_N \\ +\delta c_1 & & & -\delta c_{N-1} & g_N \end{bmatrix} \quad (12)$$

$$S^{-1} = \begin{bmatrix} B_{1,1} & \cdots & B_{1,972} & \cdots \\ & B_{2,17} & & \\ \vdots & & & \\ B_{1104,17} & \cdots & B_{1104,1104} \end{bmatrix}$$

in which each block $B_{ij}$, $1 \leq i,j \leq n$, is N×N and has low displacement rank, although many may be symbolic zeros. In general, if a Jacobian matrix J is in the form of a pattern N×N matrix of sparse n×n blocks, then $SJS^{-1}$ is in the form of a sparse n×n matrix of pattern N×N blocks. For example, the blocks of the re-arranged matrix may be dense N×N blocks but with a circulant or close-to-circulant structure. It should be noted that in a typical circuit, a significant number of the symbolic entries in either $g_k$ or $c_k$ are time-invariant. Such entries may correspond to, for example, linear circuit elements like fixed resistors or capacitors. The N×N elements corresponding to these symbolic entries will have a displacement rank of zero, which reduces the average displacement rank of the re-arranged matrix.

Figure 3:
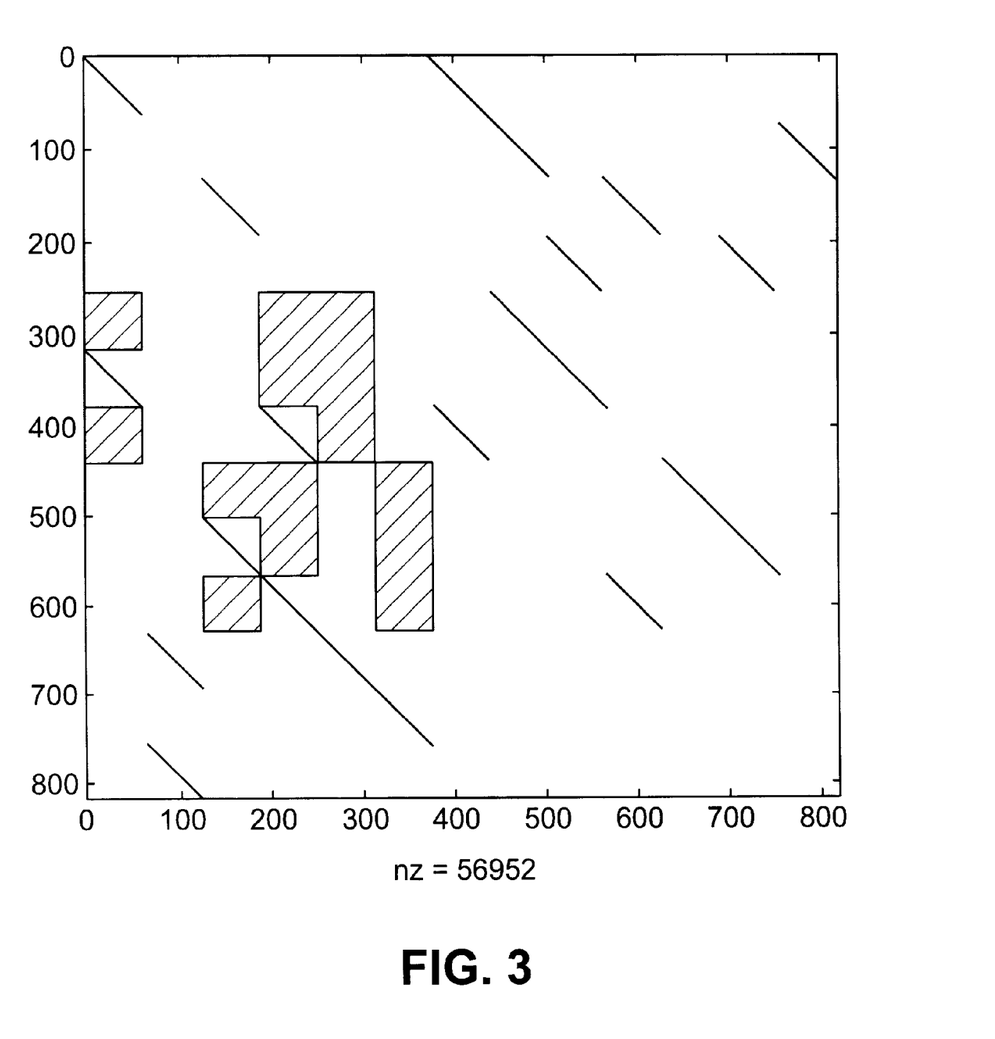
FIG. 3 shows the symbolic structure of a Jacobian matrix which may be processed in accordance with a sparse factorization process in accordance with the invention.

After the symmetric permutation, a standard sparse lower-upper (LU) factorization is performed on $SJS^{-1}$, treating the N×N blocks as arithmetic "elements." FIG. 3 shows the symbolic structure of a Jacobian matrix J in a relatively simple one-tone harmonic balance example in which n=13 and N=63. The elements which are pure diagonals, as indicated by the diagonal lines in FIG. 3, are g entries without a corresponding c entry. This is consistent with the above-noted statement that there are generally more symbolic g entries than c entries. Block fill-in generated during the factorization will generally be the same as that encountered when doing a scalar factorization on a matrix with the same symbolic structure. In typical circuit analysis applications, the block fill-in involves computation which may be on the order of about 5n or so. However, it should be noted that dense manipulation of the N×N elements can cause the computation time to increase dramatically to $O(nN^3)$ with a storage space requirement of $O(nN^2)$. The use of low displacement rank preconditioners in accordance with the invention ensures that the element arithmetic can be performed without dense manipulation and therefore with reasonable computation time and memory requirements.

The above-described processing may be implemented using a software program in which each element is represented as an instance of a C++ class element, as illustrated in the following pseudocode:

```
class element{
    static int N; // dimension of all elements
    low_rank_rep disp_matrix; //Gohberg-Olshevsky representation
of matrix public:
    element();
    ~element();
    void app(double* z);           //apply, overwrite argument
    void appT(double* z);          //apply transpose
    double pivot_select();         //maximize for best pivot
    void displace_f(double* z);    //forward displacement
    void displace_b(double* z);    //backward displacement
};
```

The sparse matrix itself, which corresponds to the right side of Equation (12), may then be stored as an array of pointers to the element class given above. An illustrative set of pseudocode for the member function element::app is provided below. The class low_rank_rep represents a displacement stored as a product $GH^T$ in which G and H are real matrices of dimension N×$\alpha$. The member function low_rank_rep::width( ) returns $\alpha$.

```
void element :: app(double* z)
{
    allocate buffers buf1 and buf2 of length N;
    buf1 = 0; //will accumulate final answer ...
    for (int k = 0; k != disp_matrix.width(); k++)
    {
        recover g_k and h_k from disp_matrix;
        buf2 = circ(h_k)^T z;
        buf1 += circ(g_k) buf2;
    }
    recover generator w of circulant from disp_matrix;
    buf1 += circ(w) z;
    z = buf1; //overwrite argument with answer
}
```

The apply operations in the above pseudocode may be performed in time $O(\alpha N \log N)$ using conventional techniques. The inverse $p^{-1}$ of the pivot element p can be stored in the same form as other elements, with an apply time of $O(\alpha N \log N)$.

The generation of low displacement rank preconditioners for a harmonic balance technique will now be described in detail. Harmonic balance analysis operates in the frequency domain, and uses a discretization process to generate a system of nN non-linear equations in nN unknowns which is solved by, for example, Newton's method. In the case of a single unknown waveform x(t), the harmonic balance equations take the form of N non-linear equations in N unknowns X, which are the coefficients in a discrete Fourier expansion of x(t):

$$H(X)=YX+\Omega\Gamma q(.)\Gamma^{-1}X+\Gamma f(.)\Gamma^{-1}X-B=0. \quad (13)$$

In the above equation, YX is the contribution of linear elements modeled in the frequency domain, the diagonal matrix $\Omega$ represents the frequency-domain differentiation operator, the operator $\Gamma$ is an N-point discrete Fourier transform (DFT), q(.) represents N-fold parallel applications of a non-linear charge/flux equation to each of the N unknowns, f(.) represents N-fold parallel applications of a non-linear resistive equation, and B is the stimulus in the frequency domain. For a system of n>1 circuit equations, additional permutation operators may be inserted to ensure that the various operators have the required vector order. Using a technique such as the well-known Newton's method to solve the harmonic balance system of equations H(X)=0 generally requires a linear solve process with a Jacobian matrix J=∂H/∂X computed at each iteration.

The Jacobian matrix J of the system of equations (13) may be written as follows:

$$J=Y+\Omega\Gamma C\Gamma^{-1}+\Gamma G\Gamma^{-1} \quad (14)$$

where $C=\text{diag}(c_k)$ and $G=\text{diag}(g_k)$ are block-diagonal matrices for n>1, with the diagonal elements representing circuit linearizations at the sampled time points $t_k$, k=1, 2, ... N. The C and G matrices may therefore be written as:

$$C = \begin{bmatrix} \frac{\partial q}{\partial x}\big|_{t_1} & & \\ & \ddots & \\ & & \frac{\partial q}{\partial x}\big|_{t_N} \end{bmatrix}, G = \begin{bmatrix} \frac{\partial f}{\partial x}\big|_{t_1} & & \\ & \ddots & \\ & & \frac{\partial f}{\partial x}\big|_{t_N} \end{bmatrix} \quad (15)$$

In other words, $c_k$ and $g_k$ are components of the matrix that would be generated by a circuit analysis program performing a small-signal analysis about a large-signal bias point corresponding to time point $t_k$. Each $c_k$ and $g_k$, which correspond to diagonal blocks of the respective C and G matrices, is a sparse matrix of dimension n×n which includes m nonzero entries. In practice, m is a small multiple of n, typically less than or equal to about 8n. The position of each of the m nonzero entries in a given C or G matrix is replicated in each of the N diagonal blocks of that C or G matrix. The Jacobian matrix is a large matrix of dimension nN×nN, and includes a number of dense N×N blocks. Direct factorization or even storage of the Jacobian matrix would be likely to require unduly excessive computer resources even for analysis of a circuit of moderate size. However, using the properties of the FFT, a matrix-vector product with the Jacobian matrix J of Equation (14) can be computed in time O(nNlogN).

A linear solve Jz=b for a given right-hand side b can be accomplished within reasonable computation time and memory bounds using pre-conditioned iterative techniques. For example, a preconditioner M may be designed which is easier to invert than J, where $M^{-1}$ J is close to the identity matrix. The solution to the preconditioned system $M^{-1}Jz=M^{-1}b$ will be the same as the solution to Jz=b, but iteration with the matrix $M^{-1}J$ should converge more quickly than with J alone. A simple choice of preconditioner M for the harmonic balance system may be obtained by limiting the spectrum of the C and G matrices in Equation (14) to just their respective DC components. This amounts to replacing C and G by their arithmetic averages over the N time points. With this approximation, the Jacobian matrix J becomes a diagonal series of un-coupled sparse blocks, which can be inverted independently. For additional details on these and other known preconditioners for harmonic balance systems, as well as other aspects of solving harmonic balance systems, see U.S. patent application Ser. No. 08/832,487 of P. Feldmann, D. Long and Robert C. Melville entitled "Efficient Frequency Domain Analysis of Large Non-Linear Analog Circuits Using Compressed Matrix Storage," P. Feldmann, R. Melville and D. Long, "Efficient Frequency Domain Analysis of Large Non-Linear Analog Circuits," in Proceedings of the Custom Integrated Circuits Conference, May 1995, R. Melville, P. Feldmann and J. Roychowdhury, "Efficient Multi-Tone Distortion Analysis of Analog Integrated Circuits," in Proceedings of the Custom Integrated Circuit Conference, May 1995, and M. Roesch and K. Antreich, "Schnelle Stationare Simulation Nichtlinearer Schaltungen im Freuenzebereich," AEUE, Vol. 46, No. 3, pp.168–176, 1992, all of which are incorporated by reference herein.

Figure 5:
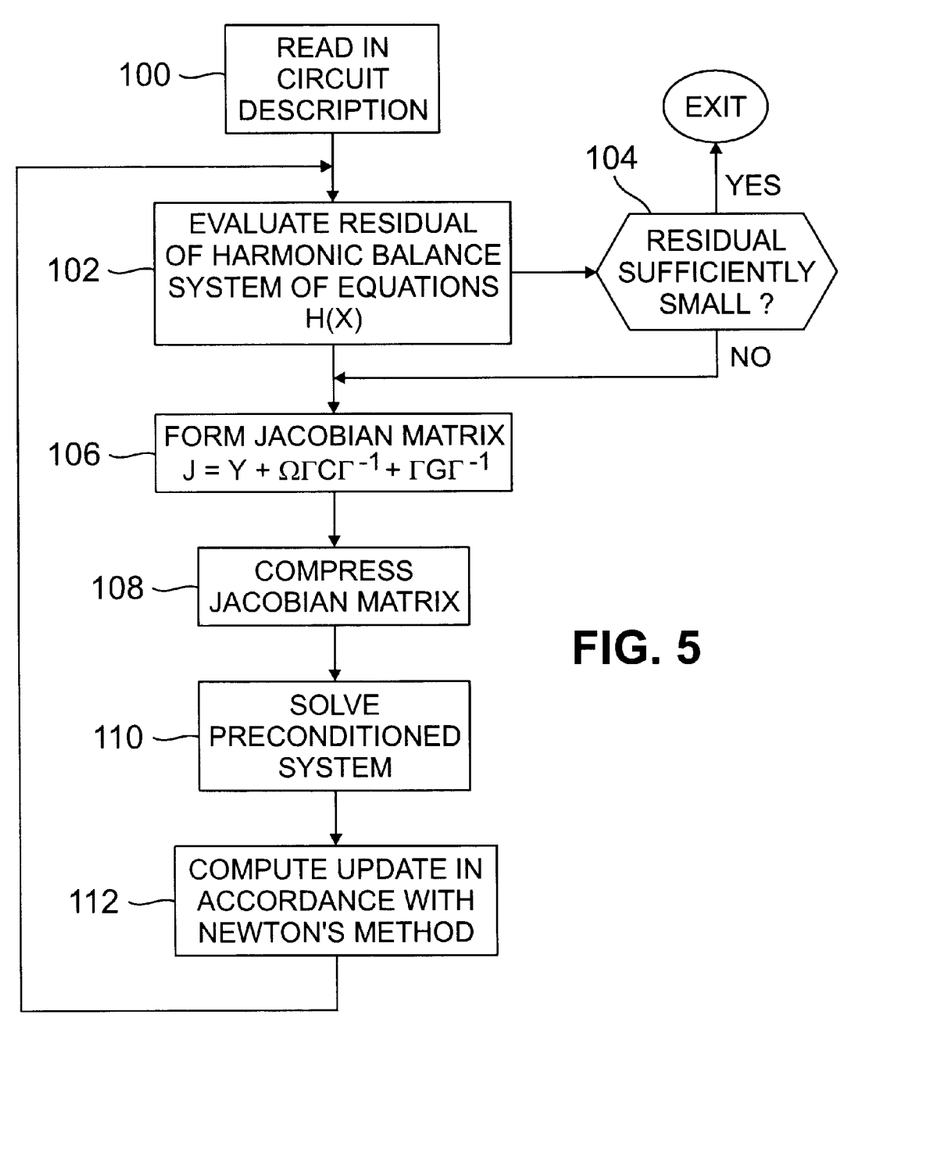
FIG. 5 is a flow diagram of a harmonic balance analysis in accordance with the invention.

FIG. 5 is a flow diagram illustrating a harmonic balance analysis process which may be implemented using low displacement rank preconditioners in accordance with the invention. The processing steps shown may be implemented in a computer program executed by processor 12 in the system of FIG. 1. In step 100, the processor 12 reads a description of a nonlinear circuit to be analyzed. The description may be read from one or more existing files in memory 14 or external storage device 26, or from manual data entries of a user at keyboard 24. The circuit description in this example includes n unknown circuit node spectra in steady-state operation. A system of harmonic balance equations in accordance with Equation (13) is then formulated. The harmonic balance equations allocate N spectral coefficients to each of the n node spectra in the circuit description of step 100, with X denoting the resulting complete set of nN unknowns. As previously noted, the system of harmonic balance equations is also designated H(X). In step 102, a residual of H(X) is evaluated using an initial approximation of X. If the magnitude of the residual is determined in step 104 to be sufficiently small, that is, less than a user-selected constant $\epsilon$, the initial approximation of X is printed or otherwise displayed as the solution and the process ends. Suitable values for the user-selected constant $\epsilon$ may be on the order of $10^{-8}$.

If the magnitude of the residual is determined in step 104 to be greater than or equal to the constant $\epsilon$, the above-described harmonic balance Jacobian matrix J of Equation (14) is formed, as indicated in step 106. Step 108 indicates that the Jacobian matrix J is then stored in a compressed format. The compressed format may be generated in the manner described in the above-cited U.S. patent application Ser. No. 08/832,487. In step 110, the preconditioned system $M^{-1}Jz=M^{-1}b$ described above is generated using a low displacement rank preconditioner in accordance with the invention, and an iterative linear equation algorithm, such as QMR or GMRES, is invoked to solve the preconditioned system. The iterative linear algorithm is terminated when the solution to the preconditioned system has been obtained to sufficient accuracy. An updated approximation to the set of unknowns X is then computed in step 112, and the process returns to step 102 to evaluate the residual of H(X) using the new approximation of X. The new approximation of X may be generated in accordance with, for example, Newton's method or Damped Newton's method, both of which are described in greater detail in J. M. Ortega and W. C. Rheinboldt, "Iterative Solutions of Non-linear Equations in Several Variables," Academic Press, New York, 1969.

As noted above, a simple conventional preconditioner for the harmonic balance Jacobian matrix J in Equation (14) is obtained by replacing C and G with their averages, such that the entire construction becomes block diagonal. A stronger preconditioner for the Jacobian matrix J may be obtained in accordance with the invention by augmenting the averages with additional spectral components. Although this augmentation introduces off-diagonal components which prevent the use of block-diagonal solvers, the invention solves this problem by providing a special-purpose direct factorization process to accommodate the augmented preconditioners. With suitable permutations, the Jacobian matrix J can be put in the form of an n×n sparse matrix of N×N blocks, where N is the transform dimension. This is based on the observation that, even when off-diagonal terms are included, most of the matrix entries still correspond to linearized circuit components, and will be diagonal blocks. Typically only c<<n columns will contain non-diagonal elements. By permuting the matrix so that these c columns are on the right side of the matrix, the first n-c columns may be processed using a block diagonal solver, although a rectangular LU decomposition will generally be required.

The updates to the remaining c columns as a result of this factorization can be shown to be well-controlled, and in fact one need only process the lower c×c submatrix. This matrix, which is of size cN×cN at the individual element level, represents a Schur complement of the augmented preconditioner. If the number of different harmonic diagonals or "stripes" is relatively small, the number of entries in this Schur complement is $O(c^2N)$. If the augmenting entries are harmonically related, then this Schur complement can be directly factored without significant fill-in. Otherwise, an incomplete factorization may be used. The overall linear solve with pre-conditioning includes a block forward substitution with the L part of the factorization of the leftmost (n-c)N columns, a solve with the Schur complement, and a block backward substitution with the U part from the leftmost (n-c)N columns. The time required for this process is only about two to three times that needed for a block-diagonal preconditioner.

Another effective preconditioner for processing the harmonic balance Jacobian matrix in accordance with the invention may be obtained by converting the Jacobian matrix in (14) to the time domain, as follows:

$$\Gamma^{-1}(Y+\Omega\Gamma C\Gamma^{-1}+\Gamma G\Gamma^{-1})\Gamma=\Gamma^{-1}Y\Gamma+\Gamma^{-1}\Omega\Gamma C+G \qquad (16)$$

This process involves an extra forward and inverse FFT for each application of the preconditioner, at a cost of O(nNlogN). Note that this is the same asymptotic time as for residual computation, although no device evaluation is required, so the cost of the extra FFTs is negligible. It should also be noted that $\Gamma^{-1}Y\Gamma$ and $\Gamma^{-1}\Omega\Gamma$ are block-circulant matrices. If C and G are approximated by block diagonal matrices with the same entry in each diagonal position, then the entire matrix (16) is block circulant and easy to invert. This represents a time-domain version of the block-diagonal preconditioner in the frequency domain. In an alternative embodiment, the requirement that C and G be constant along diagonals can be relaxed. For example, the discretization sample points $[t_1, t_2, \ldots, t_N]$ may be partitioned into a number $\beta<<N$ of averaging sections of equal length, and individual averages for C and G computed in each section. Values of β on the order of 4 or 8 will be acceptable in many applications, although other values could also be used.

Figure 4A:
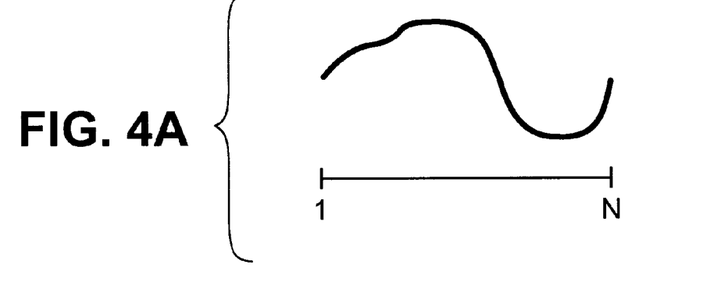
FIGS. 4A, 4B and 4C illustrate waveforms associated with multi-section averaging in a harmonic balance analysis in accordance with the invention.
Figure 4B:
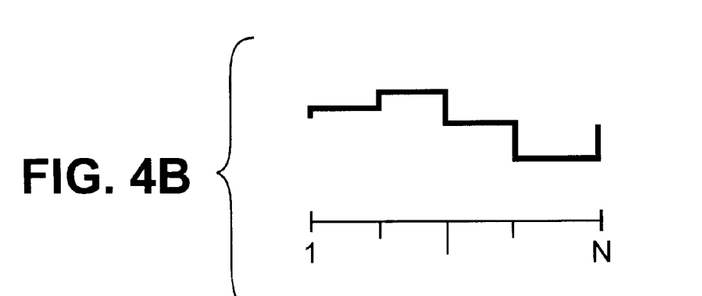
Figure 4C:
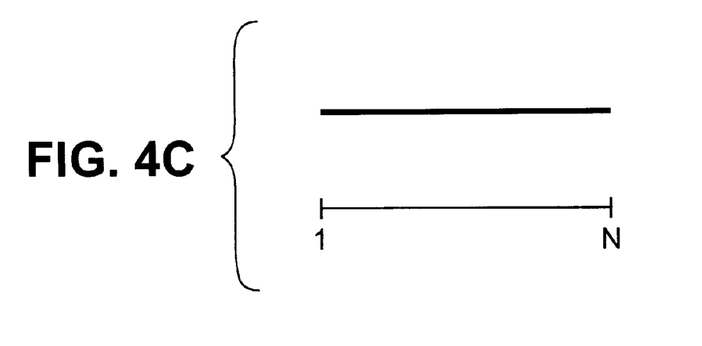

FIGS. 4A, 4B and 4C illustrate the above-described sectional averaging process. FIG. 4A shows a $g_k$ waveform corresponding to a transconductance of a small non-linear circuit. FIG. 4C shows the extreme case in which the $g_k$ waveform is replaced with its average across all N time points. This corresponds to the block-diagonal case described above. FIG. 4B shows a four-section (β=4) average in accordance with the invention. The four-section average produces a square-wave like approximation to the $g_k$ waveform as shown. Even with only four sections, the fit to the $g_k$ waveform is much better than the single section average. The approximations of C and G by a β-section average will be designated avg(C, β) and avg(G, β), respectively. As a result of the sparsity of the G matrix, avg(G, β) can be computed from G in time O(nN). The preconditioner may be written as:

$$J_\beta=\Gamma^{-1}Y\Gamma+\Gamma^{-1}\Omega\Gamma\mathrm{avg}(C,\beta)+\mathrm{avg}(G,\beta) \qquad (17)$$

with β small but greater than one. The preconditioned matrix $J_\beta$ can be factored within reasonable computation and storage requirements, using the theory of low displacement rank as described in, for example, T. Kailath and A. Sayed, "Displacement Structure: Theory and Applications," SIAM Review, Vol. 37, No. 3, pp. 297–386, September 1995, which is incorporated by reference herein.

The preconditioned Jacobian matrix $J_\beta$ may be rewritten using a series representation of the type described in I. Gohberg and V. Olshevsky, "Complexity of Multiplication With Vectors for Structures Matrices," Linear Algebra and Applications, 202, pp. 163–192, 1994, which is incorporated by reference herein. Assume that $J_\beta$ satisfies the following series representation:

$$J_\beta - ZJ_\beta Z^{-1} = RS^T \qquad (18)$$

in which Z is the cyclic shift operator and R and S are matrices of dimension N×α. Then, $J_\beta$ may be rewritten as:

$$J_\beta = circ_1(x) + \frac{\phi}{\phi-\psi}\sum_{k=1}^{\alpha} circ_\phi(r_k)circ_\psi(s_k)^T \qquad (19)$$

in which $r_k$ and $S_k$ are the columns of R and S, respectively, and φ, ψ are arbitrary complex numbers, where φ≠ψ. The notation $circ_\phi(x)$ denotes a factor circulant, which is a matrix whose first column is an N-vector x as in a regular circulant, except that every entry above the main diagonal is multiplied by a constant factor φ. Thus $circ_1(x)$ is a conventional circulant with first column x. As in portions of the previous description, the case of n=1 is described here for notational simplicity. The more realistic case of n>1 will make use of appropriate permutations to put the matrix $J_\beta$ in the form of a sparse matrix of N×N blocks.

Using the FFT, a matrix-vector product with an N-dimensional factor circulant can be accomplished in time O(NlogN) rather than $O(N^2)$, which allows an apply of Equation (19) in time O(αNlogN). Moreover, the inverse of $J_\beta$ has substantially the same form with a series representation of the same length. The series length α is within about a factor of two of β, the number of averaging sections. The inversion of the preconditioned matrix $J_\beta$ may be accomplished with an object-oriented extension of a conventional sparse LU factorization which manipulates arithmetic "elements" rather than floating point numbers. Each element of the factorization may be stored in the series of Equation (19). The inversion time and apply time for the inverted preconditioned matrix $J_\beta^{-1}$ are roughly $\beta$ times more expensive than the time to invert or apply the block diagonal preconditioner, which may be viewed as the frequency domain form of $J_1$.

The above-described embodiments of the invention are intended to be illustrative only. Numerous alternative embodiments within the scope of the following claims will be apparent to those skilled in the art.

What is claimed is:

1. A computer-implemented method for analyzing and adjusting the operation of a device characterized under a set of operating conditions by a plurality of unknowns, based on a system of equations in which a plurality of coefficients are used to represent each of the unknowns, the method comprising the steps of:

applying a preconditioner to a representation of the system of equations to generate a preconditioned linear system, wherein the preconditioner is characterized as a matrix which includes a plurality of compressed blocks;

generating an output representative of the operation of the device under the set of operating conditions, based at least in part on a solution of the preconditioned linear system, wherein the solution is obtained by performing operations on the compressed blocks of the preconditioner matrix; and utilizing the output to adjust a parameter of the device.

2. The method of claim 1 wherein the device is characterized by n unknowns with N coefficients used to represent each of the unknowns, the representation is a Jacobian matrix in the form of an n×n matrix of N×N blocks, and the preconditioner is characterized by an n×n matrix of compressed blocks in which at least a subset of the compressed blocks are represented by substantially less than $N^2$ elements.

3. The method of claim 2 wherein at least a subset of the compressed blocks are low displacement rank matrices, each corresponding to a product of two generator matrices having dimension N×α, where α<<N.

4. The method of claim 2 wherein solving the preconditioned linear system includes the step of factoring the n×n preconditioner matrix using a sparse lower-upper (LU) factorization applied to the compressed blocks.

5. The method of claim 1 wherein the system of equations is a system of finite differencing equations, and the representation is a Jacobian matrix of the system of finite differencing equations.

6. The method of claim 1 wherein the system of equations is a system of harmonic balance equations, and the representation is a Jacobian matrix of the system of harmonic balance equations.

7. The method of claim 2 wherein the step of applying a preconditioner further includes the steps of:

converting sub-matrices of the Jacobian matrix to corresponding time series, such that there is one such series for each non-zero sub-matrix of the Jacobian matrix;

separating a portion of a given signal waveform represented in the system of equations into a plurality of averaging sections;

averaging each of the time series within each of the plurality of averaging sections, to generate in each of the sections a sectional average for the given waveform and other waveforms;

generating a set of sub-matrices including the sectional averages; and processing the set of sub-matrices to generate the preconditioner.

8. The method of claim 7 wherein the plurality of averaging sections includes about two to eight averaging sections.

9. The method of claim 1 further including the step of receiving user input including an indication of at least a subset of the operating conditions and at least a subset of the unknowns.

10. The method of claim 1 further including the step of displaying to a user the results of a simulation of the operation of the device under the set of operating conditions, based on a solution of the preconditioned linear system.

11. An apparatus for analyzing and adjusting the operation of a device characterized under a set of operating conditions by a plurality of unknowns, the apparatus comprising:

a memory for storing at least a portion of a representation of a system of equations in which a plurality of coefficients are used to represent each of the unknowns; and a processor coupled to the memory and operative to apply a preconditioner to the representation of the system of equations so as to generate a preconditioned linear system, wherein the preconditioner is characterized as a matrix which includes a plurality of compressed blocks, and wherein the processor is fiber operative to generate an output representative of the operation of the device under the set of operating conditions, based at least in part on a solution of the preconditioned linear system, wherein the solution is obtained by performing operations on the compressed blocks of the preconditioner matrix, and further wherein the output is utilized to adjust at least one parameter of the device.

12. The apparatus of claim 11 wherein the device is characterized by n unknowns with N coefficients used to represent each of the unknowns, the representation is a Jacobian matrix in the form of an n×n matrix of N×N blocks, and the preconditioner is characterized by an n×n matrix of compressed blocks in which at least a subset of the compressed blocks are represented by substantially less than $N^2$ elements.

13. The apparatus of claim 12 wherein at least a subset of the compressed blocks are in the form of low displacement rank matrices, each corresponding to a product of two generator matrices having dimension N×α, where α<<N.

14. The apparatus of claim 12 wherein the processor is further operative to solve the preconditioned linear system by factoring the n×n preconditioner matrix using a sparse lower-upper (LU) factorization applied to the compressed blocks.

15. The apparatus of claim 11 wherein the system of equations is a system of finite differencing equations, and the representation is a Jacobian matrix of the system of finite differencing equations.

16. The apparatus of claim 11 wherein the system of equations is a system of harmonic balance equations, and the representation is a Jacobian matrix of the system of harmonic balance equations.

17. The apparatus of claim 12 wherein the processor is further operative: (i) to convert sub-matrices of the Jacobian matrix to corresponding time series, such that there is one such series for each non-zero sub-matrix of the Jacobian matrix; (ii) to separate a portion of a given signal waveform represented in the system of equations into a plurality of averaging sections; (iii) to average each of the time series within each of the plurality of averaging sections, so as to generate in each of the sections a sectional average for the given waveform and other waveforms; (iv) to generate a set of sub-matrices including the sectional averages; and (v) to process the set of sub-matrices to generate the preconditioner.

18. The apparatus of claim 17 wherein the plurality of averaging sections includes about two to eight averaging sections.

19. An apparatus for analyzing and adjusting the operation of a device characterized under a set of operating conditions by a plurality of unknowns, based on a system of equations in which a plurality of coefficients are used to represent each of the unknowns, the apparatus comprising:

means for applying a preconditioner to a representation of the system of equations to generate a preconditioned linear system, wherein the preconditioner is characterized as a matrix which includes a plurality of compressed blocks;

means for generating an output representative of the operation of the device under the set of operating conditions, based at least in part on a solution of the preconditioned linear system, wherein the solution is obtained by performing operations on the compressed blocks of the preconditioner matrix; and means for utilizing the output to adjust a parameter of the device.

20. The apparatus of claim 19 wherein the device is characterized by n unknowns with N coefficients used to represent each of the unknowns, the representation is a Jacobian matrix in the form of an n×n matrix of N×N blocks, and the preconditioner is characterized by an n×n matrix of compressed blocks in which at least a subset of the compressed blocks are represented by substantially less than $N^2$ elements.

21. The apparatus of claim 20 wherein at least a subset of the compressed blocks are low displacement rank matrices, each corresponding to a product of two generator matrices having dimension N×α, where α<<N.

22. The apparatus of claim 19 wherein the preconditioner matrix is factored using a sparse lower-upper (LU) factorization applied to the compressed blocks of the preconditioner matrix.

23. The apparatus of claim 19 wherein the applying means and the generating means are implemented as elements of a computer.

* * * * *